United States Patent
Tian et al.

(10) Patent No.: US 12,265,142 B1
(45) Date of Patent: Apr. 1, 2025

(54) MAGNETIC PARTICLE IMAGING (MPI) DEVICE BASED ON ASYMMETRIC BILATERAL STRUCTURE

(71) Applicant: Beihang University, Beijing (CN)

(72) Inventors: Jie Tian, Beijing (CN); Zhenchao Tang, Beijing (CN); Guangxing Zhou, Beijing (CN); Yu An, Beijing (CN)

(73) Assignee: Beihang University, Beijing (CN)

( * ) Notice: Subject to any disclaimer, the term of this patent is extended or adjusted under 35 U.S.C. 154(b) by 0 days.

(21) Appl. No.: 18/922,363

(22) Filed: Oct. 21, 2024

(30) Foreign Application Priority Data

Mar. 7, 2024 (CN) .......................... 202410257753.4

(51) Int. Cl.
*G01R 33/12* (2006.01)
(52) U.S. Cl.
CPC ................................ *G01R 33/1276* (2013.01)
(58) Field of Classification Search
CPC ................ G01R 33/1276; G01R 33/00; G01R 33/0035; G01R 33/0023; G01R 33/0017; G01R 31/3191; G01R 33/0358; G01R 33/0356; G01B 7/004; G01C 17/38; G06F 3/017; G06F 3/0346; G06F 3/012; H01L 39/223
See application file for complete search history.

(56) References Cited

U.S. PATENT DOCUMENTS

| 2017/0067972 A1* | 3/2017 | Diamond | ........... G01R 33/1276 |
| 2021/0059557 A1 | 3/2021 | Jong et al. | |

FOREIGN PATENT DOCUMENTS

| CN | 114403843 A | | 4/2022 | |
| CN | 115067917 A | * | 9/2022 | ........... A61B 5/0515 |
| CN | 115813366 A | | 3/2023 | |
| CN | 116019436 A | | 4/2023 | |
| KR | 20230077576 A | | 6/2023 | |
| WO | WO-2022019835 A1 | * | 1/2022 | ........... A61B 5/0035 |

* cited by examiner

*Primary Examiner* — Jermele M Hollington
*Assistant Examiner* — Taqi R Nasir
(74) *Attorney, Agent, or Firm* — Bayramoglu Law Offices LLC (57) ABSTRACT

A magnetic particle imaging (MPI) device based on an asymmetric bilateral structure includes a fixed section and a movable section. The fixed section includes a pair of magnetic field generation coils, and the magnetic field generation coils are configured to generate a uniform and variable magnetic field and drive a field-free point (FFP) to move along a Z-axis direction. The movable section includes a permanent magnet, excitation coils and a reception coil. The permanent magnet is configured to cooperate with the magnetic field generation coils to generate the FFP. The excitation coils are configured to move the FFP on a two-dimensional plane and excite magnetic particles to generate a nonlinear response signal. The reception coil is configured to receive an MPI signal. The MPI device is simple in structure and convenient to operate, and can perform targeted local imaging or covered overall imaging on the target object.

9 Claims, 5 Drawing Sheets

MAGNETIC PARTICLE IMAGING (MPI) DEVICE BASED ON ASYMMETRIC BILATERAL STRUCTURE

CROSS REFERENCE TO THE RELATED APPLICATIONS

This application is based upon and claims priority to Chinese Patent Application No. 202410257753.4, filed on Mar. 7, 2024, the entire contents of which are incorporated herein by reference.

TECHNICAL FIELD

The present invention belongs to the technical field of biomedical imaging, and particularly relates to a magnetic particle imaging (MPI) device based on an asymmetric bilateral structure.

BACKGROUND

MPI is an emerging non-invasive tomography technology, which was first proposed in 2005. It uses a static gradient field of a magnetic field to construct a field-free point (FFP) or a field-free line (FFL), uses a driving field to drive a magnetic-free area to move, and then activates a nonlinear response signal of magnetic particles through an excitation coil. This technology does not involve radioactive tracers and has no limitations on the depth of imaging, so it is considered to have broad application prospects in angiography, cell tracing, cancer diagnosis and treatment, and other fields.

According to a construction method of a selected field in an MPI device, the existing magnet design structures based on FFP or FFL can be roughly divided into a symmetrical bilateral structure and a unilateral structure. The unilateral structure has the advantages of a simple structural design, a small device size, a low power consumption, and a large movable imaging range. However, because the magnetic field distribution of the unilateral structure attenuates with the increase of distance, the position of the magnetic field-free area constructed by the unilateral structure is relatively shallow, and there are obvious depth limitations for imaging that involves the deep parts of the human body. The advantage of the symmetrical bilateral structure is that there is no depth limitation, and the constructed selected field has high linearity. However, in order to achieve a large imaging field of view, a complex structural design is required, which will lead to a large device size and high power consumption. Moreover, as the field of view increases, the rapid decrease in the gradient of the selected field will also lead to a decline in imaging quality.

It is understood that the development of MPI technology can achieve more efficient imaging effects than existing clinical imaging device. For example, in the present clinical interventional treatment for guiding thermal ablation of liver cancer, the development of MPI is expected to display temperature changes at different locations in the lesion area inside the liver during treatment and provide real-time feedback on the treatment situation. In addition, it can realize non-invasive real-time diagnosis of the severity of coronary plaque inflammation in the clinical needs of diagnosis of coronary plaque inflammation. In view of the above-mentioned clinical needs, it can be found that achieving real-time imaging under the human field of view is an urgent problem to be solved in the development of MPI technology.

Based on the above, the prevent invention provides an MPI device based on an asymmetric bilateral structure.

SUMMARY

In order to solve the above-mentioned problems in the prior art, that is, the problems of limited imaging range of existing magnetic nanoparticle imaging devices and insufficient imaging depth for a human trunk position, the present invention provides an MPI device based on an asymmetric bilateral structure. The MPI device includes a fixed section and a movable section.

The fixed section includes a pair of magnetic field generation coils, and the magnetic field generation coils are configured to generate a uniform and variable magnetic field and drive the FFP to move along a Z-axis direction.

The movable section includes a permanent magnet, excitation coils and a reception coil.

The permanent magnet is configured to cooperate with the magnetic field generation coils to generate the FFP. The excitation coils are configured to move the FFP on a two-dimensional plane and excite magnetic particles to generate a nonlinear response signal. The reception coil is configured to receive an MPI signal.

The Z-axis direction is an axial direction of the permanent magnet, and the two-dimensional plane is perpendicular to the Z-axis direction.

In some preferred embodiments, the magnetic field generation coils include a first magnetic field generation coil and a second magnetic field generation coil.

The first magnetic field generation coil and the second magnetic field generation coil are symmetrically arranged at a center of an imaging field of view. Direct currents of an equal magnitude and a same direction are introduced into the first magnetic field generation coil and the second magnetic field generation coil, and the first magnetic field generation coil and the second magnetic field generation coil cooperate with the permanent magnet to generate the FFP between the first magnetic field generation coil and the second magnetic field generation coil.

In some preferred embodiments, a shape of the permanent magnet includes a cylindrical shape, and the excitation coils are uniformly arranged around an outer circumferential surface of the permanent magnet.

The excitation coils include two pairs, which are respectively a first pair of excitation coils and a second pair of excitation coils, and alternating currents of an equal magnitude and opposite directions are respectively introduced into two excitation coils in a same pair.

The first pair of excitation coils includes a first excitation coil and a second excitation coil.

The first excitation coil and the second excitation coil are centrosymmetric along an axis of the permanent magnet.

The second pair of excitation coils includes a third excitation coil and a fourth excitation coil.

The third excitation coil and the fourth excitation coil are centrosymmetric along the axis of the permanent magnet.

In some preferred embodiments, a connection line between the center of the first excitation coil and the center of the second excitation coil in the same end face is taken as a first connection line.

A connection line between the center of the third excitation coil and the center of the fourth excitation coil in the same end face is taken as a second connection line.

The first connection line is perpendicular to the second connection line.

In some preferred embodiments, the reception coil is arranged at the bottom of the excitation coils.

In some preferred embodiments, a size of an imaging range is changed by changing a distance between the first magnetic field generation coil and the second magnetic field generation coil or current magnitudes.

In some preferred embodiments, both the first magnetic field generation coil and the second magnetic field generation coil include Helmholtz coils.

In some preferred embodiments, a use method of the MPI device includes:

Placing a target object injected with magnetic nanoparticles at a center position of the uniform magnetic field between the first magnetic field generation coil and the second magnetic field generation coil, and introducing direct currents of an equal magnitude and a same direction, where at this time, the FFP is generated under the action of a magnetic field of the permanent magnet;

Respectively, introducing alternating currents of an equal magnitude and opposite directions into two excitation coils in the first pair of excitation coils as well as the second pair of excitation coils for moving the FFP to achieve two-dimensional planar scanning at a fixed height, exciting the MPI signal when the FFP is driven to move, and receiving the MPI signal by the reception coil and performing reconstruction to obtain an MPI two-dimensional image;

Superimposing low-frequency and high-amplitude alternating currents on the first magnetic field generation coil and the second magnetic field generation coil to move the FFP in the Z-axis direction and perform two-dimensional planar scanning on layers at different heights, receiving the MPI signal of each layer by the reception coil, and at the same time, decoding, by the computer, the MPI signal and reconstructing an MPI three-dimensional image using an MPI imaging algorithm; and According to a size of the target object and the imaged region, determining whether it is necessary to move the movable section for real-time imaging in a larger range until imaging requirements of the target object are met.

In some preferred embodiments, the MPI imaging algorithm at least includes a systematic matrix imaging method or an X-space imaging method.

In some preferred embodiments, the alternating currents of the equal magnitude and opposite directions are respectively introduced into the two excitation coils in the first pair of excitation coils as well as the second pair of excitation coils as follows:

the current $I_1$ introduced into the first excitation coil is:

$$I_1 = Ix \times \cos(2 \times pi \times fx \times t);$$

the current $I_2$ introduced into the second excitation coil is:

$$I_2 = -Ix \times \cos(2 \times pi \times fx \times t);$$

the current $I_3$ introduced into the third excitation coil is:

$$I_3 = Iy \times \cos(2 \times pi \times fy \times t);$$

the current $I_4$ introduced into the fourth excitation coil is:

$$I_4 = -Iy \times \cos(2 \times pi \times fy \times t);$$

where Ix is an amplitude of the currents introduced into the first excitation coil and the second excitation coil; fx is a frequency of the currents introduced into the first excitation coil and the second excitation coil; Iy is an amplitude of the currents introduced into the third excitation coil and the fourth excitation coil; fy is a frequency of the currents introduced into the third excitation coil and the fourth excitation coil; pi is $\pi$; and t is a time variable of a current function with time.

Beneficial Effects of the Present Invention

In the present invention, the FFP is generated by the permanent magnet and the magnetic field generation coils at the movable section. In the imaging method for a large field of view, this method can reduce the power consumption of the device, and at the same time, the FFP generated through the permanent magnet has a large gradient, which can achieve high spatial resolution of imaging. In addition, the size of the imaging field of view depends on the size of the uniform magnetic field area constructed by the magnetic field generation coils. The size of the imaging field of view can be changed by changing the distance between the coils and the magnitude of the applied current. This design is simple in structure and convenient to operate. During the imaging scanning process, targeted local imaging or covered overall imaging can be performed on the target object according to the position of the movable section, and real-time three-dimensional spatial imaging can be achieved according to the magnitude of the applied excitation frequency. The device and method of the present invention are expected to achieve the purpose of diagnosis and treatment of diseases in the human trunk.

BRIEF DESCRIPTION OF THE DRAWINGS

By referring to the following figures and a detailed description of non-restrictive embodiments, the other features, purposes and advantages of the present application will become more obvious.

DETAILED DESCRIPTION OF THE EMBODIMENTS

The present application is further explained in detail below in combination with the drawings and embodiments. It is understandable that the specific embodiments described herein are only used to explain the relevant invention and not to limit the present invention. It is also important to note that for the sake of description, only the parts related to the present invention are shown in the drawings.

It should be noted that the embodiments in the present application and the features in the embodiments may be combined with each other without conflict. The present application will be explained in detail below with reference to the drawings and embodiments.

Figure 1:
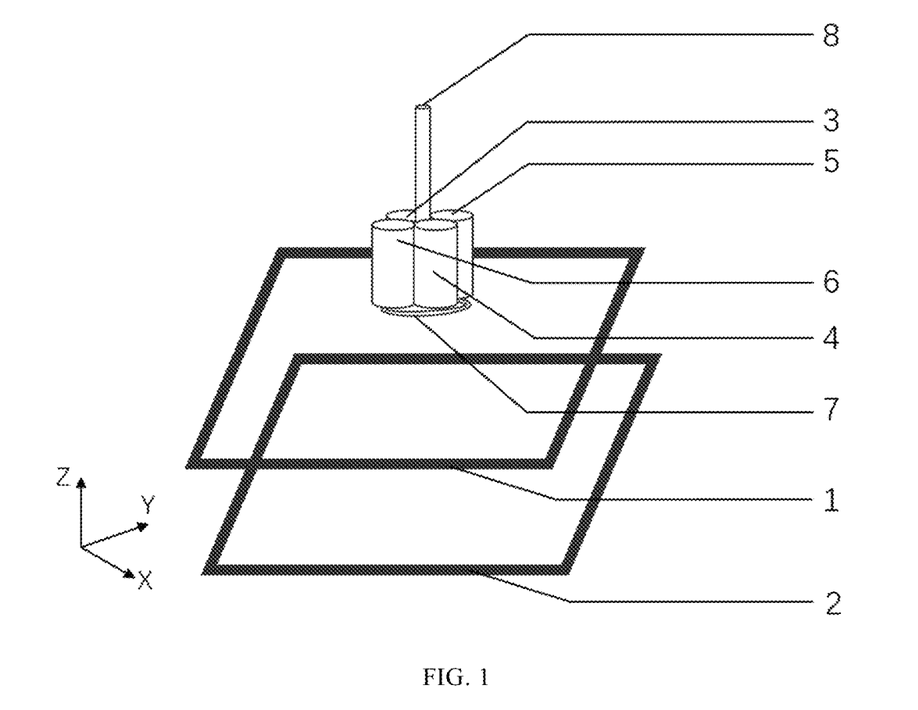
FIG. 1 is a schematic diagram showing the structure of an MPI device based on an asymmetric bilateral structure according to the present invention.
Figure 2:
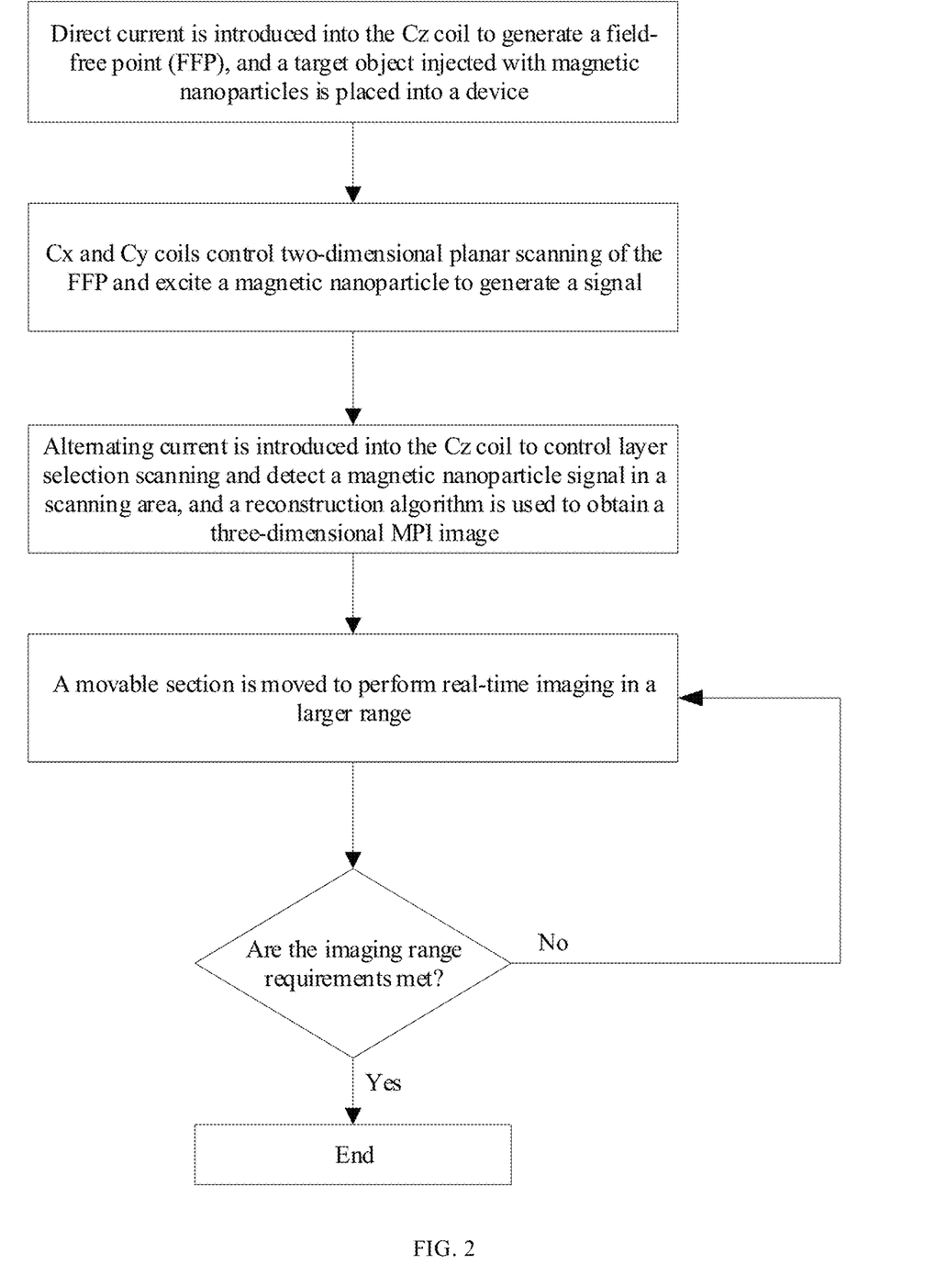
FIG. 2 is a schematic flow chart of a use method of the MPI device based on the asymmetric bilateral structure according to the present invention.
Figure 3:
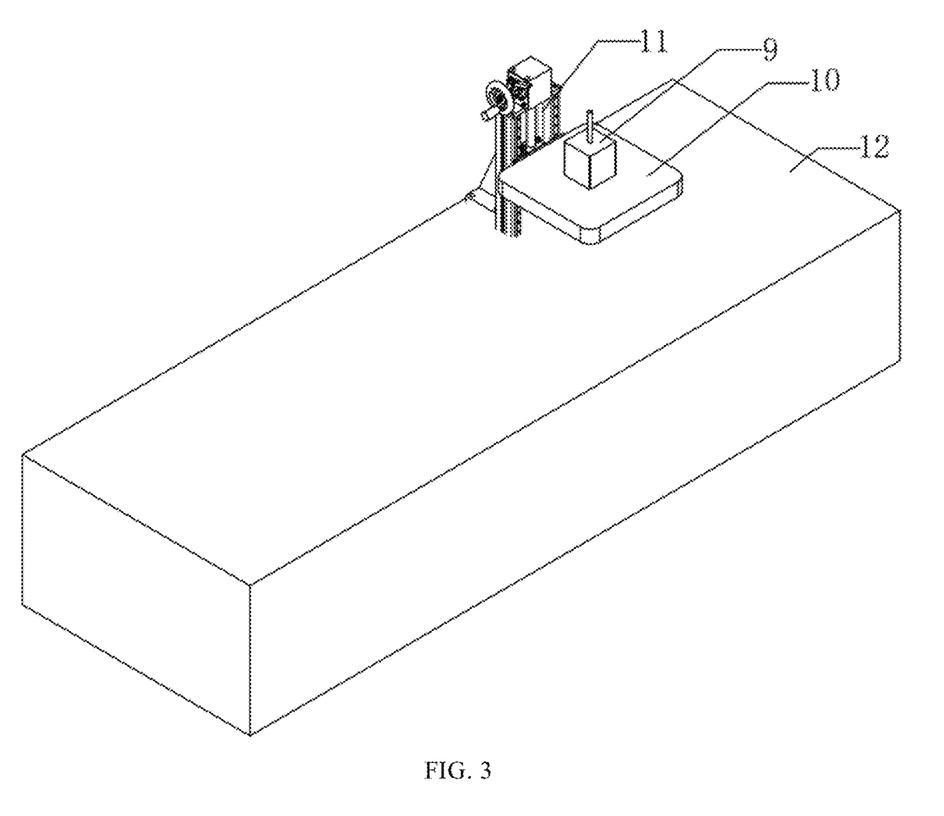
FIG. 3 is an axonometric view of the installed MPI device based on the asymmetric bilateral structure according to the present invention.
Figure 4:
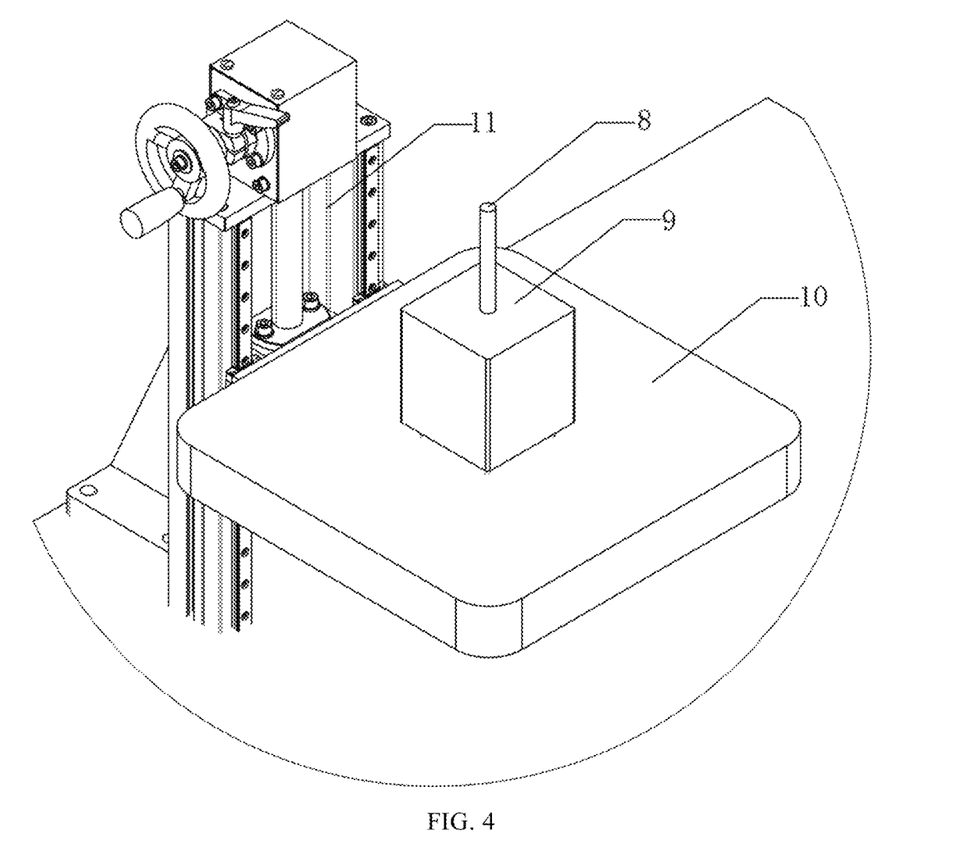
FIG. 4 is a partial enlarged view of the structure in FIG. 3.
Figure 5:
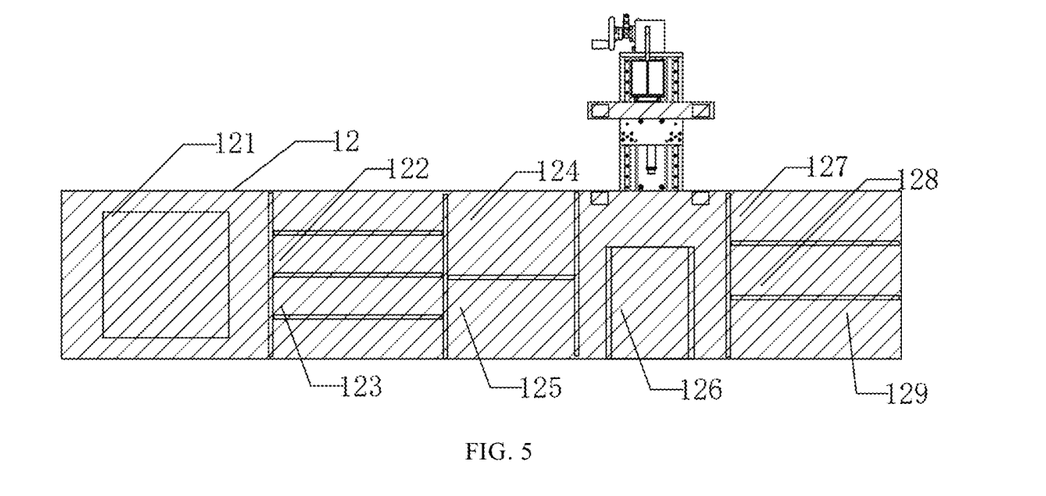
FIG. 5 is a schematic diagram showing the internal structure of the installed MPI device based on the asymmetric bilateral structure according to the present invention.
Figure 6:
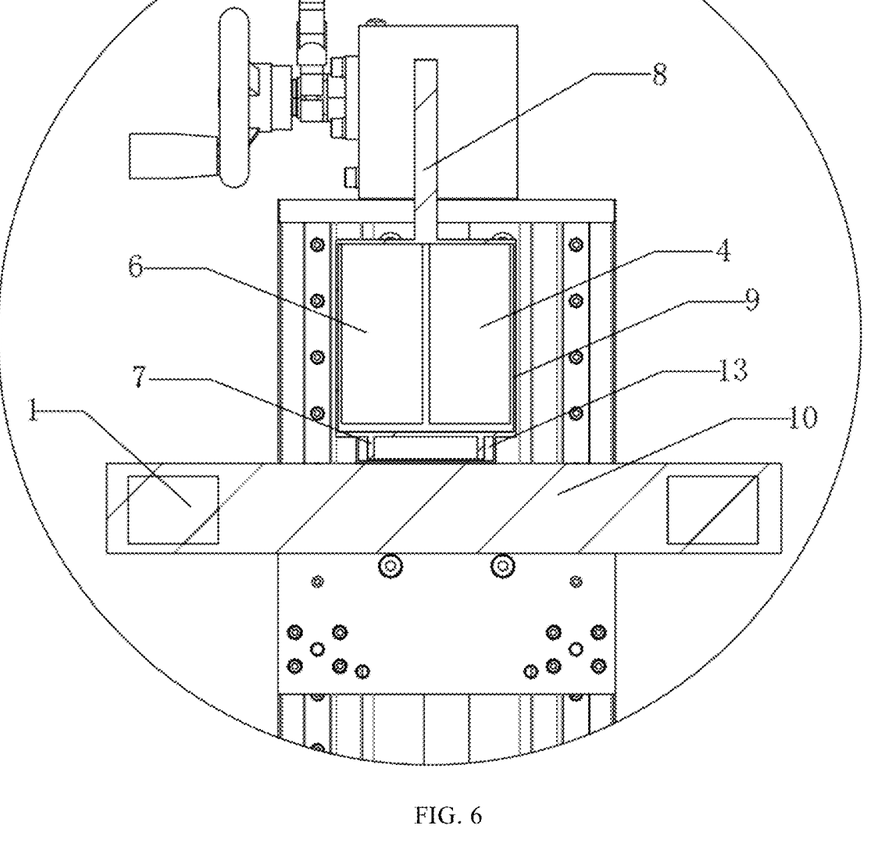
FIG. 6 is a partial enlarged view of the structure in FIG. 5.

As shown in FIGS. 1-2, the present invention provides an MPI device based on an asymmetric bilateral structure, and the MPI device includes a fixed section and a movable section.

The fixed section includes a pair of magnetic field generation coils, and the magnetic field generation coils are configured to generate a uniform and variable magnetic field and drive an FFP to move along a Z-axis direction.

The movable section includes the permanent magnet 8, excitation coils and the reception coil 7.

The permanent magnet 8 is configured to cooperate with the magnetic field generation coils to generate the FFP. The excitation coils are configured to move the FFP on a two-dimensional plane and excite magnetic particles to generate a nonlinear response signal. The reception coil 7 is configured to receive an MPI signal.

The Z-axis direction is the axial direction of the permanent magnet 8, and the two-dimensional plane is perpendicular to the Z-axis direction.

The magnetic field generation coils work in a power supply method of direct current superimposed alternating current.

The magnetic field generation coils are named Cz coils.

In order to meet the requirements of the human field of view and real-time imaging that need to be urgently solved by an MPI device, the present invention proposes a design based on an asymmetric bilateral structure to achieve the imaging range of the human field of view and the real-time imaging. The design includes a movable section and a fixed section, which takes into account the advantages of a symmetrical bilateral structure with a large depth and a unilateral structure with a large movable range, a simple structure and a low power consumption. Two pairs of orthogonal excitation coils are designed on the movable section to achieve fast two-dimensional planar scanning of FFP. In addition, the imaging range can be expanded by moving the movable section of the structure in the range of a uniform magnetic field.

The asymmetric bilateral structure in the MPI device based on the asymmetric bilateral structure, according to the present invention is mainly reflected in the hardware design of the coil, and the combination of the movable section and the fixed section reflects the asymmetric bilateral structure design of the MPI device in hardware.

As a further explanation of the present invention, the magnetic field generation coils include the first magnetic field generation coil 1 and the second magnetic field generation coil 2.

The first magnetic field generation coil 1 and the second magnetic field generation coil 2 are arranged at the center of the imaging field of view symmetrically. Direct currents of an equal magnitude and the same direction are introduced into the first magnetic field generation coil 1 and the second magnetic field generation coil 2, where the current magnitude is $I_{z1}$, and the first magnetic field generation coil 1 and the second magnetic field generation coil 2 cooperate with the permanent magnet 8 to generate the FFP between the first magnetic field generation coil 1 and the second magnetic field generation coil 2.

As a further explanation of the present invention, the shape of the permanent magnet 8 includes a cylindrical shape, and the excitation coils are uniformly arranged around the outer circumferential surface of the permanent magnet 8.

The excitation coils include two pairs, which are respectively the first pair of excitation coils and the second pair of excitation coils, and alternating currents of an equal magnitude and opposite directions are respectively introduced into two excitation coils in the same pair.

The first pair of excitation coils includes the first excitation coil 3 and the second excitation coil 4.

The first excitation coil 3 and the second excitation coil 4 are centrosymmetric along the axis of the permanent magnet 8.

The second pair of excitation coils includes the third excitation coil 5 and the fourth excitation coil 6.

The third excitation coil 5 and the fourth excitation coil 6 are centrosymmetric along the axis of the permanent magnet 8.

The first pair of excitation coils is named Cx coils, and the second pair of excitation coils is named Cy coils. The three-dimensional movement of the FFP is realized through the Cz coils, the Cx coils and the Cy coils. Specifically, the magnetic field generated by the Cx coils and the Cy coils is not only configured to drive the FFP to perform two-dimensional movement, but also configured to perform orthogonal excitation to generate an MPI nonlinear response signal.

The two pairs of excitation coils, Cx coils and Cy coils, are placed on the movable section to drive the FFP to move while exciting magnetic nanoparticles in an orthogonal excitation manner to generate a signal. This excitation design not only simplifies the structural design and reduces the size of the device, but also can achieve real-time imaging of the device.

The permanent magnet 8 with the cylindrical shape at the movable section is defined as Y, and the magnetic field in the Z direction generated by the permanent magnet 8 acts on the uniform magnetic field generated by the Cz coils to generate the FFP.

The reception coil 7 is named Cr and has the same direction as the Cz coils, and the reception coil 7 is configured to induce the MPI signal of the magnetic nanoparticles.

As a further explanation of the present invention, a connection line between the center of the first excitation coil 3 and the center of the second excitation coil 4 in the same end face is taken as a first connection line.

A connection line between the center of the third excitation coil 5 and the center of the fourth excitation coil 6 in the same end face is taken as a second connection line. The first connection line is perpendicular to the second connection line.

As a further explanation of the present invention, the reception coil 7 is arranged at the bottom of the excitation coils. Compared with a traditional symmetrical uniform reception coil, this design is simple and small in size, and can improve the sensitivity of the reception coil 7.

As a further explanation of the present invention, the size of the imaging range is changed by changing the distance between the first magnetic field generation coil 1 and the second magnetic field generation coil 2 or current magnitudes. This method is simple in design and structure and convenient to operate.

As a further explanation of the present invention, both the first magnetic field generation coil 1 and the second magnetic field generation coil 2 include Helmholtz coils.

The present invention uses a permanent magnet 8 and a pair of Helmholtz coils to generate the FFP, which replaces the traditional symmetrical structure generation method and expands the imaging range.

Concretely, referring to FIGS. 3-6, the specific installation structures of the fixed section and the movable section are as follows:

The movable section further includes the first housing 9 and the second housing 13. The first pair of excitation coils and the second pair of excitation coils are installed inside the first housing 9. The permanent magnet 8 passes through the upper surface of the first housing 9 and is installed inside the first housing 9.

The reception coil 7 is installed inside the second housing 13, and the first housing 9 is fixed on the upper surface of the second housing 13.

The lower surface of the second housing 13 is placed above the third housing 10, the first magnetic field generation coil 1 is installed inside the third housing 10, and the third housing 10 is installed on a moving end of the manual displacement table 11. The manual displacement table 11 can realize the upward and downward movement of the third housing 10 by rotating a turntable manually, thereby driving the movable section and the first magnetic field generation coil 1 to move upward and downward. The manual displacement table 11 belongs to the prior art, including but not limited to a nut and screw structure, and its specific structure is not described here.

The manual displacement table 11 is installed on the upper surface of the outside of the bed base 12, and the second magnetic field generation coil 2 is fixedly installed on the upper surface of the inside of the bed base 12. An organizing space of the inside of the bed base 12 is divided into different functional units according to a signal propagation chain of MPI, which include the cooling unit 121, the signal transmission unit 122, the power amplification unit 123, the impedance matching unit 124, the excitation-end filtering unit 125, the compensation unit 126, the signal acquisition unit 127, the receiver-end filtering unit 128, the amplification unit 129, and others. The above-mentioned functional units belong to the prior art, and their specific functions are not described here.

In order to reduce external noise interference, in the present invention, the manual displacement table 11 along the Z-axis direction is used to achieve the adjustment of the distance between the first magnetic field generation coil 1 and the second magnetic field generation coil 2, and the manual displacement table 11 is designed and processed using nonmagnetic materials. The present invention can facilitate scanning of the human body size.

As a further explanation of the present invention, referring to FIG. 2, a use method of the MPI device is as follows:

Step S10: a target object injected with magnetic nanoparticles is placed at the center position of the uniform magnetic field between the first magnetic field generation coil 1 and the second magnetic field generation coil 2, and direct currents of an equal magnitude and the same direction are introduced; at this time, the FFP is generated under the action of a magnetic field of the permanent magnet 8.

Step S20: alternating currents of an equal magnitude and opposite directions are respectively introduced into two excitation coils in the first pair of excitation coils as well as the second pair of excitation coils for moving the FFP to achieve two-dimensional planar scanning at a fixed height, the MPI signal is excited when the FFP is driven to move, and the MPI signal is received by the reception coil 7 and reconstructed to obtain an MPI two-dimensional image.

The Cr coil is configured to receive the MPI signal, and the received MPI signal is filtered and amplified and then transmitted to a computer. The two-dimensional plane concentration distribution map of the magnetic nanoparticles at a fixed height position in the body of the target object is solved according to an MPI imaging algorithm to serve as the MPI two-dimensional image.

Step S30: low-frequency and high-amplitude alternating currents are superimposed on the first magnetic field generation coil 1 and the second magnetic field generation coil 2 to move the FFP in the Z-axis direction and perform two-dimensional planar scanning on layers at different heights, the MPI signal of each layer is received by the reception coil 7, and at the same time, the computer decodes the MPI signal and reconstructs an MPI three-dimensional image using the MPI imaging algorithm.

Step S40: according to the size of the target object and the imaged region, it is determined whether it is necessary to move the movable section for real-time imaging in a larger range until imaging requirements of the target object are met.

As a further explanation of the present invention, the MPI imaging algorithm at least includes a systematic matrix imaging method or an X-space imaging method, and any imaging algorithm shall fall within the scope of protection of the present invention.

As a further explanation of the present invention, the alternating currents of the equal magnitude and opposite directions are respectively introduced into the two excitation coils in the first pair of excitation coils as well as the second pair of excitation coils as follows:

the current $I_1$ introduced into the first excitation coil 3 is:

$$I_1 = Ix \times \cos(2 \times pi \times fx \times t);$$

the current $I_2$ introduced into the second excitation coil 4 is:

$$I_2 = -Ix \times \cos(2 \times pi \times fx \times t);$$

the current $I_3$ introduced into the third excitation coil 5 is:

$$I_3 = Iy \times \cos(2 \times pi \times fy \times t);$$

the current $I_4$ introduced into the fourth excitation coil 6 is:

$$I_4 = -Iy \times \cos(2 \times pi \times fy \times t);$$

where Ix is an amplitude of the currents introduced into the first excitation coil 3 and the second excitation coil 4; fx is a frequency of the currents introduced into the first excitation coil 3 and the second excitation coil 4; Iy is an amplitude of the currents introduced into the third excitation coil 5 and the fourth excitation coil 6; fy is a frequency of the currents introduced into the third excitation coil 5 and the fourth excitation coil 6; pi is π; and t is a time variable of a current function with time.

The layer selection operation of the FFP is realized by superimposing alternating currents on the Cz coils, and the current magnitude is Iz2×cos(2×pi×fz×t), where Iz2 is an amplitude of the currents introduced into the Cz coils, and fz is a frequency of the currents introduced into the Cz coils.

Although the above embodiments describe all steps in the above order, those skilled in the art can understand that, in order to achieve the effect of the present embodiment, different steps are not necessarily performed in such an order, and the steps can be executed simultaneously (in parallel) or in reverse order, and these simple changes are within the scope of protection of the present invention.

In the description of the present invention, the terms "center", "upper", "lower", "left", "right", "vertical", "horizontal", "inside", "outside" and other terms indicating directions or positional relationships are based on the directions or positional relationships shown in the drawings, which is only for convenience of description, and does not indicate or imply that the device or element must have a specific orientation or be constructed and operate in a specific orientation, and therefore they cannot be understood as limitations on the present invention. In addition, the terms "first", "second", "third", etc., are only used for descriptive purposes and cannot be understood as indicating or implying a relative importance.

In addition, it should also be noted that in the description of the present invention, unless otherwise explicitly specified and limited, the terms "installed", "connection" and "connected" should be understood broadly. For example, connection can be a fixed connection, a detachable connection, or an integrated connection; it can be a mechanical connection or an electrical connection; it can be a direct connection, an indirect connection through intermediate media, or an internal communication between two elements. For those skilled in the art, the specific meanings of the above terms in the present invention can be understood according to specific situations.

The term "include/including" or any other similar term is intended to indicate non-exclusive inclusion, so that a process, method, article or equipment/device that includes a series of elements includes not only those elements, but also other elements that are not explicitly listed, or elements inherent in the process, method, article or equipment/device.

Based on the above, the technical solutions of the present invention have been described in conjunction with the preferable embodiments shown in the drawings, but it is easy for those skilled in the art to understand that the scope of protection of the present invention is obviously not limited to these specific embodiments. On the premise that it does not deviate from the principle of the present invention, those skilled in the art can make equivalent changes or replacements to the relevant technical features, and the technical solutions obtained after these changes or replacements will fall within the scope of protection of the present invention.

The invention claimed is:

1. A magnetic particle imaging (MPI) device based on an asymmetric bilateral structure, comprising a fixed section and a movable section;
    the fixed section comprises a pair of magnetic field generation coils, and the magnetic field generation coils are configured to generate a uniform and variable magnetic field and drive the field-free point (FFP) to move along a Z-axis direction;
    the movable section comprises a permanent magnet, excitation coils and a reception coil;
    the permanent magnet is configured to cooperate with the magnetic field generation coils to generate the FFP; the excitation coils are configured to move the FFP on a two-dimensional plane and excite magnetic particles to generate a nonlinear response signal; the reception coil is configured to receive an MPI signal;
    the Z-axis direction is an axial direction of the permanent magnet, and the two-dimensional plane is perpendicular to the Z-axis direction;
    the magnetic field generation coils comprise a first magnetic field generation coil and a second magnetic field generation coil; and
    the first magnetic field generation coil and the second magnetic field generation coil are symmetrically arranged at a center of an imaging field of view; direct currents of an equal magnitude and a same direction are introduced into the first magnetic field generation coil and the second magnetic field generation coil, and the first magnetic field generation coil and the second magnetic field generation coil cooperate with the permanent magnet to generate the FFP between the first magnetic field generation coil and the second magnetic field generation coil.

2. The MPI device based on the asymmetric bilateral structure according to claim 1, wherein the shape of the permanent magnet comprises a cylindrical shape, and the excitation coils are uniformly arranged around an outer circumferential surface of the permanent magnet;
    the excitation coils comprise a first pair of excitation coils and a second pair of excitation coils, and alternating currents of an equal magnitude and opposite directions are respectively introduced into two excitation coils in a same pair;
    the first pair of excitation coils comprises a first excitation coil and a second excitation coil;
    the first excitation coil and the second excitation coil are centrosymmetric along an axis of the permanent magnet;
    the second pair of excitation coils comprises a third excitation coil and a fourth excitation coil; and
    the third excitation coil and the fourth excitation coil are centrosymmetric along the axis of the permanent magnet.

3. The MPI device based on the asymmetric bilateral structure according to claim 2, wherein a connection line between a center of the first excitation coil and a center of the second excitation coil in a first same end face is taken as a first connection line;
    a connection line between a center of the third excitation coil and a center of the fourth excitation coil in a second same end face is taken as a second connection line; and
    the first connection line is perpendicular to the second connection line.

4. The MPI device based on the asymmetric bilateral structure according to claim 3, wherein the reception coil is arranged at a bottom of the excitation coils.

5. The MPI device based on the asymmetric bilateral structure according to claim 4, wherein a size of an imaging range is changed by changing a distance between the first magnetic field generation coil and the second magnetic field generation coil or current magnitudes.

6. The MPI device based on the asymmetric bilateral structure according to claim 4, wherein both the first magnetic field generation coil and the second magnetic field generation coil comprise Helmholtz coils.

7. The MPI device based on the asymmetric bilateral structure according to claim 6, wherein a use method of the MPI device comprises:
    placing a target object injected with magnetic nanoparticles at a center position of the uniform and variable magnetic field between the first magnetic field generation coil and the second magnetic field generation coil, and introducing direct currents of an equal magnitude and a same direction, wherein at this time, the FFP is generated under an action of a magnetic field of the permanent magnet;
    respectively introducing alternating currents of an equal magnitude and opposite directions into two excitation coils in the first pair of excitation coils as well as the second pair of excitation coils for moving the FFP to achieve two-dimensional planar scanning at a fixed height, exciting the MPI signal when the FFP is driven to move, and receiving the MPI signal by the reception coil and performing reconstruction to obtain an MPI two-dimensional image;
    superimposing low-frequency and high-amplitude alternating currents on the first magnetic field generation coil and the second magnetic field generation coil to move the FFP in the Z-axis direction and perform two-dimensional planar scanning on layers at different heights, receiving the MPI signal of each layer by the reception coil, and at the same time, decoding, by a computer, the MPI signal and reconstructing an MPI three-dimensional image using an MPI imaging algorithm; and according to a size of the target object and an imaged region, determining whether it is necessary to move the movable section for real-time imaging in a larger range until imaging requirements of the target object are met.

8. The MPI device based on the asymmetric bilateral structure according to claim 7, wherein the MPI imaging algorithm comprises a systematic matrix imaging method or an X-space imaging method.

9. The MPI device based on the asymmetric bilateral structure according to claim 8, wherein the alternating currents of the equal magnitude and opposite directions are respectively introduced into the two excitation coils in the first pair of excitation coils as well as the second pair of excitation coils as follows:

a current $I_1$ introduced into the first excitation coil is:
$$I_1 = Ix \times \cos(2 \times pi \times fx \times t);$$

a current $I_2$ introduced into the second excitation coil is:
$$I_2 = -Ix \times \cos(2 \times pi \times fx \times t);$$

a current $I_3$ introduced into the third excitation coil is:
$$I_3 = Iy \times \cos(2 \times pi \times fy \times t);$$

a current $I_4$ introduced into the fourth excitation coil is:
$$I_4 = -Iy \times \cos(2 \times pi \times fy \times t);$$

wherein Ix is an amplitude of the current $I_1$ introduced into the first excitation coil and the current $I_2$ introduced into the second excitation coil; fx is a frequency of the current $I_1$ introduced into the first excitation coil and the current $I_2$ introduced into the second excitation coil; Iy is an amplitude of the current $I_3$ introduced into the third excitation coil and the current $I_4$ introduced into the fourth excitation coil; fy is a frequency of the current $I_3$ introduced into the third excitation coil and the current $I_4$ introduced into the fourth excitation coil; pi is $\pi$; and t is a time variable of a current function with time.

* * * * *